(12) United States Patent
Klemm et al.

(10) Patent No.: US 9,989,596 B2
(45) Date of Patent: *Jun. 5, 2018

(54) DISCHARGE STATE INDICATOR

(75) Inventors: Torsten Klemm, Bad Soden (DE); Gerrit Rönneberg, Darmstadt (DE)

(73) Assignee: The Gillette Company LLC, Boston, MA (US)

(*) Notice: Subject to any disclaimer, the term of this patent is extended or adjusted under 35 U.S.C. 154(b) by 1275 days.

This patent is subject to a terminal disclaimer.

(21) Appl. No.: 13/417,443

(22) Filed: Mar. 12, 2012

(65) Prior Publication Data

US 2012/0169258 A1 Jul. 5, 2012

(30) Foreign Application Priority Data

Dec. 29, 2005 (DE) ........................ 10 2005 063 045

(51) Int. Cl.
*H02J 7/00* (2006.01)
*H02K 7/00* (2006.01)
*G01N 27/416* (2006.01)
*G01R 31/36* (2006.01)
*B26B 19/38* (2006.01)

(52) U.S. Cl.
CPC ........ *G01R 31/3682* (2013.01); *B26B 19/388* (2013.01); *B26B 19/3873* (2013.01)

(58) Field of Classification Search
CPC .................................................. H02J 7/0031
USPC .... 320/125–136; 361/23, 30, 33, 78, 79, 86, 361/90, 92; 310/47; 324/426
See application file for complete search history.

(56) References Cited

U.S. PATENT DOCUMENTS

| 4,019,112 A | | 4/1977 | Satoh |
| 4,639,656 A | | 1/1987 | Mukai |
| 4,703,247 A | * | 10/1987 | Morioka ............... H02J 7/008 320/136 |
| 4,829,290 A | * | 5/1989 | Ford ............... G01R 19/16542 340/636.15 |
| 6,496,344 B1 | | 12/2002 | Hog |
| 7,102,684 B1 | * | 9/2006 | Higuchi et al. ............... 348/372 |

FOREIGN PATENT DOCUMENTS

| DE | 36 22 991 | 1/1988 |
| DE | 38 29 073 | 12/1989 |
| DE | 199 11 590 | 5/2000 |
| EP | 0 604 444 | 9/1995 |
| EP | 0 712 007 | 9/1999 |

(Continued)

*Primary Examiner* — Drew A Dunn
*Assistant Examiner* — Michael Dibenedetto
(74) *Attorney, Agent, or Firm* — John M. Lipchitz; Kevin C. Johnson; Steven W. Miller

(57) ABSTRACT

A circuit for displaying the state of a battery that is almost discharged features a battery, an inductive load, and a controllable switch connected in series. The circuit also includes a display element connected in series with the inductive load and the battery. The controllable switch is opened when a voltage of the battery is lower than a first threshold level and is only closed again when the voltage of the battery is greater than a second threshold level. The circuit may also include a control circuit having a comparator which compares the voltage of the battery with the first threshold level and the second threshold level and triggers the controllable switch accordingly.

15 Claims, 1 Drawing Sheet

(56) References Cited

FOREIGN PATENT DOCUMENTS

| | | |
|---|---|---|
| JP | 04-115073 U1 | 10/1992 |
| JP | 11-187471 | 9/1999 |
| WO | WO 01/78211 | 10/2001 |

\* cited by examiner

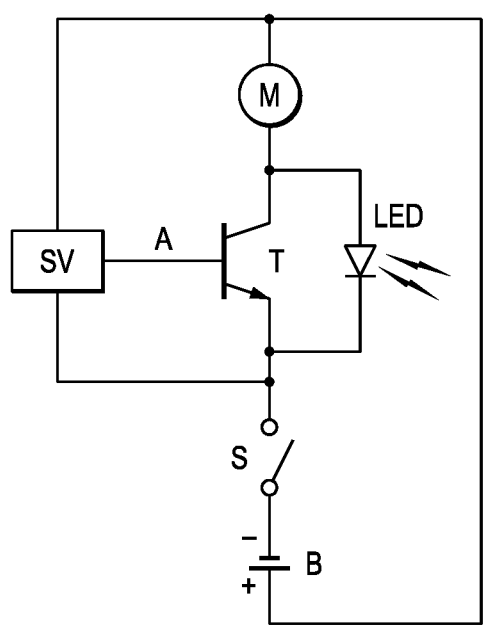

DISCHARGE STATE INDICATOR

CROSS REFERENCE TO RELATED APPLICATIONS

This application is a continuation application of U.S. application Ser. No. 12/159,260, filed on Jun. 26, 2008, which is a continuation of PCT/EP2006/011882, filed on Dec. 9, 2006, which claims priority from DE102005063045.6, filed on Dec. 29, 2005. The subject matter of each of these applications is incorporated herein by reference in their entireties.

FIELD OF THE INVENTION

This disclosure relates to circuits for displaying a discharge state of a battery when a voltage of the battery has dropped below a certain threshold level.

BACKGROUND OF THE INVENTION

DE 36 22 991 A1 describes a circuit that is usable with battery-operated appliances for indicating a discharge state of a battery. The circuit includes a series connection of a battery, a throttle and a collector-emitter segment of a transistor. A light-emitting diode is in parallel with the collector-emitter segment of the transistor. If a voltage of the battery is lower than a certain reference level, a base of the transistor is triggered periodically so the transistor is alternately conducting and blocking current flow and therefore a pulsating current flows through the throttle. A clock pulse of the current flow is determined by an RC member. On blockage of the transistor, a voltage which is added to the battery voltage is induced in the throttle, so a forward voltage of the light-emitting diode is reached and the diode lights up.

SUMMARY OF THE INVENTION

In one aspect, a discharge state indicator circuit includes a battery, an inductive load (e.g., an electric motor) and a controllable switch (e.g., a transistor) connected in series. The circuit also includes a display device (e.g., a light-emitting diode (LED)) connected in series with the inductive load and the battery. The controllable switch is opened when a voltage of the battery (i.e., battery voltage) is less than a certain first threshold level and is closed only when the voltage of the battery is greater than a certain second threshold level. The circuit may also include a control circuit having a comparator which compares the voltage of the battery with the first threshold level and the second threshold level and triggers the controllable switch accordingly.

The circuit makes use of the effects of an internal resistance of a battery, which ensures a drop in the voltage of the battery when a current withdrawn from the battery rises. The circuit is usable with, for example, small battery-operated electric appliances having an inductive load, in which the inductive load has a higher electric power consumption than a display device for display of the almost discharged state of the battery, and, in which the voltage of the battery is too low, at least in the almost discharged state, to operate the display device. Examples of such small electric appliances include electric shavers or electric toothbrushes which have an electric motor and a battery with only one cell as the inductive load, but the voltage of the cell is usually too low to operate a light-emitting diode which should indicate to the user that the battery is almost discharged.

To generate a voltage high enough to operate the display device, the circuit operates like known throttle transformers, in which an inductive load is used as the throttle to save on parts and costs. For example, if the battery of the circuit is discharged, due to operation of the inductive load, to such an extent that the battery voltage is lower than a first threshold level, then the inductive load is shut down by opening the controllable switch. In this way, a voltage is induced in the inductive load and is added to the voltage of the battery and is sufficient for operating the display device. Since the display device has a lower power consumption than the inductive load, the battery recovers, i.e., the battery voltage rises. When the battery voltage rises to a level that is greater than a second threshold level, then the controllable switch is closed, so that the display device goes off because the induced voltage collapses. At the same time, the battery is again put under such a high load by the inductive load that the battery voltage drops below the first threshold level, whereupon the procedure described above is repeated until the battery is discharged to the extent that after opening the controllable switch, the voltage of the battery no longer rises to a level greater than the second threshold level. In this case, the controllable switch remains opened, i.e., the inductive load is turned off and the battery is protected from being completely discharged.

The controllable switch can be controlled by a control circuit such as a supervisory circuit. In some cases, the supervisory circuit includes a comparator and a circuit for generating a reference voltage. If a power supply voltage of the supervisory circuit drops below the reference voltage, then an output of the comparator is switched to LOW. If the power supply voltage rises to a level that is greater than the reference voltage by the amount of a hysteresis voltage (i.e., the difference between the first and second threshold levels of the circuit), then the output of the comparator switches to HIGH with a certain time lag. This time lag is determined by the speed of the supervisory circuit in comparing the battery voltage with the reference voltage and may be lengthened, if necessary, by an additional dead time that is adjustable as needed.

A clock frequency is determined by the recovery time of the battery, the lag time and the difference between the first and second threshold levels, i.e., the hysteresis voltage. In some cases, the first threshold level is the same as the second threshold level. In this case, the clock frequency is also determined by the recovery time of the battery and the lag time. The clock frequency and consequently also the brightness of the display device (e.g., light-emitting diode) can also depend on the internal resistance of the battery, which is greater in the case of a discharged battery than in the case of a charged battery.

BRIEF DESCRIPTION OF THE DRAWINGS

FIG. 1 is a schematic view of a circuit for indicating a charge state of a battery for use with small battery-operated electrical appliances.

DETAILED DESCRIPTION OF THE INVENTION

FIG. 1 illustrates a discharge state indicator circuit for use with a small battery-operated electrical appliance such as an electric shaver or an electric toothbrush. The circuit includes a series connection with a battery B, an inductive load (electric motor M), a controllable switch (transistor T), and a mechanical switch S, which is used for switching the small electric appliance on and off. A display device (light-emitting diode LED) is connected in parallel with a collector-emitter segment of the transistor T. The circuit also includes a supervisory circuit SV connected to the battery B. An output terminal (A) of the supervisory circuit SV is connected to a base terminal of the transistor T.

If the voltage of the battery voltage drops below a first threshold level, the supervisory circuit SV triggers the transistor T and thereby switches the electric motor M off allowing the battery B to recover, i.e., allowing the voltage of the battery B to increase. If the voltage of the battery B battery voltage exceeds a second threshold level, which is greater than the first threshold level by an amount equal to a hysteresis voltage of the supervisory circuit, then, after a lag time, the supervisory circuit SV switches the electric motor on again via the transistor T. If the voltage of the battery B then drops back below the first threshold level, the procedure described here is repeated with a certain clock frequency. The clock frequency may be adjusted through suitable dimensioning of the lag time and the hysteresis voltage of the supervisory circuit SV. The circuit is designed with dimensions so that a sufficiently high voltage is induced each time after the electric motor M is switched off, so that the light-emitting diode LED is triggered to light up. As a result, the light-emitting diode flickers or flashes with the clock frequency, thereby indicating a nearly discharged state of the battery.

If the battery B is discharged to the extent that, after shutdown of the electric motor M, the voltage of the battery B no longer rises to a level greater than the second threshold level, then the transistor T remains opened, i.e., electric motor M remains deactivated even when the mechanical switch S is closed, so that the battery B is protected from being completely discharged.

What is claimed is:

1. A battery-operated shaver comprising:
   a discharge state indicator circuit comprising:
   a battery,
   an inductive load connected to the battery,
   a controllable switch connected in series with the inductive load and the battery, and
   a display element connected in series with the inductive load and the battery, wherein when a voltage of the battery is lower than a first threshold level the controllable switch opens to change a state of the display element and a voltage that is induced in the inductive load is added to the voltage of the battery sufficient for operating the display device.

2. The battery-operated shaver of claim 1, wherein the controllable switch prevents operation of the inductive load when the voltage of the battery is lower than a second threshold level.

3. The battery-operated shaver of claim 1, wherein the second threshold level is greater than the first threshold level.

4. The battery-operated shaver of claim 1, wherein the inductive load has a higher electric power consumption than the display element.

5. The battery-operated shaver of claim 1, wherein the inductive load comprises an electric motor.

6. The battery-operated shaver of claim 5, wherein the controllable switch prevents operation of the electric motor when the voltage of the battery is lower than a second threshold level.

7. The battery-operated shaver of claim 6, wherein the second threshold level is greater than the first threshold level.

8. The battery-operated shaver of claim 6, further comprising a mechanical switch connected in series with the controllable switch, the inductive load, and the battery.

9. The battery-operated shaver of claim 8, wherein the electric motor is prevented from operation even when the mechanical switch is closed.

10. The battery-operated shaver of claim 1, wherein the display element comprises a light-emitting diode.

11. The battery-operated shaver of claim 10, wherein the light-emitting diode flashes indicating a nearly discharged state of the battery.

12. The battery-operated shaver of claim 1, wherein the controllable switch comprises a transistor.

13. The battery-operated shaver of claim 12, wherein a collector-emitter segment of the transistor is connected in series with the inductive load and the battery.

14. The battery-operated shaver of claim 12, further comprising a control circuit having an input terminal connected to the battery and an output terminal connected to a base terminal of the transistor, wherein the control circuit is configured to control the transistor based on the voltage of the battery.

15. The battery-operated shaver of claim 12, wherein the display element is connected in parallel with a collector-emitter segment of the transistor.

* * * * *